(12) United States Patent
Wang

(10) Patent No.: US 9,779,814 B2
(45) Date of Patent: Oct. 3, 2017

(54) NON-VOLATILE STATIC RANDOM ACCESS MEMORY DEVICES AND METHODS OF OPERATIONS

(75) Inventor: Lee Wang, Diamond Bar, CA (US)

(73) Assignee: Flashsilicon Incorporation, Diamond Bar, CA (US)

( * ) Notice: Subject to any disclaimer, the term of this patent is extended or adjusted under 35 U.S.C. 154(b) by 552 days.

(21) Appl. No.: 13/206,270

(22) Filed: Aug. 9, 2011

(65) Prior Publication Data

US 2013/0039127 A1    Feb. 14, 2013

(51) Int. Cl.
*G11C 11/00* (2006.01)
*G11C 14/00* (2006.01)

(52) U.S. Cl.
CPC ...... *G11C 14/0054* (2013.01); *G11C 14/0063* (2013.01)

(58) Field of Classification Search
CPC . G11C 14/00; G11C 14/0054; G11C 14/0063; G11C 11/412; G11C 8/16
USPC .................. 365/185.08, 185.07, 154, 230.05
See application file for complete search history.

(56) References Cited

U.S. PATENT DOCUMENTS

| | | | |
|---|---|---|---|
| 5,488,579 A * | 1/1996 | Sharma et al. | 365/185.08 |
| 6,117,721 A * | 9/2000 | Dennison et al. | 438/238 |
| 6,333,877 B1 | 12/2001 | Nagaoka | |
| 6,556,487 B1 * | 4/2003 | Ratnakumar et al. | 365/185.08 |
| 6,965,524 B2 * | 11/2005 | Choi | 365/185.08 |
| 7,054,194 B2 | 5/2006 | Liaw | |
| 7,110,293 B2 * | 9/2006 | Jung | 365/185.08 |
| 7,164,608 B2 * | 1/2007 | Lee | 365/189.05 |
| 7,307,872 B2 * | 12/2007 | Kang et al. | 365/154 |
| 7,336,519 B2 * | 2/2008 | Ishii | 365/63 |
| 7,515,465 B1 | 4/2009 | Wang | |
| 7,663,917 B2 * | 2/2010 | Cuppens et al. | 365/185.08 |
| 7,733,700 B2 | 6/2010 | Wang | |
| 2011/0273925 A1 * | 11/2011 | Yamamoto | G11C 14/0081 365/154 |

FOREIGN PATENT DOCUMENTS

| | | |
|---|---|---|
| JP | S60136995 | 7/1985 |
| JP | 2001195893 | 7/2001 |

* cited by examiner

*Primary Examiner* — Kretelia Graham
(74) *Attorney, Agent, or Firm* — Muncy, Geissler, Olds & Lowe, P.C.

(57) ABSTRACT

Non-Volatile Static Random Access Memory (NVSRAM) cell devices applying only one single non-volatile element embedded in a conventional Static Random Access Memory (SRAM) cell are disclosed. The NVSRAM cell devices can be integrated into a compact cell array. The NVSRAM devices of the invention have a read/write speed of a conventional SRAM and non-volatile property of a non-volatile memory cell. The methods of operations for the NVSRAM devices of the invention are also disclosed.

14 Claims, 10 Drawing Sheets

NON-VOLATILE STATIC RANDOM ACCESS MEMORY DEVICES AND METHODS OF OPERATIONS

BACKGROUND OF THE INVENTION

Field of the invention

This invention relates to Non-Volatile Static Random Access Memory (NVSRAM) and the methods of operations. In particular, only one single non-volatile element embedded in a conventional SRAM cell forms an NVSRAM cell device of the invention. A plurality of NVSRAM cell devices of the invention can be integrated into a compact memory array. Due to a new configuration of the NVSRAM device of the invention, switching elements in the conventional NVSRAM devices to isolate the SRAM cell from the high voltages of writing and erase operations of the non-volatile element are omitted. The operations of the NVSRAM cells of the invention are also simplified. The NVSRAM device of the invention has a read/write speed of a conventional SRAM and non-volatile property of a non-volatile memory cell.

Description of the Related Art

Semiconductor memories have been broadly applied to electronic systems. Electronic systems require semiconductor memories for storing instructions and datum from the basic functions of controls to the complex computing processes. Semiconductor memories can be catalogued as volatile memories and non-volatile memories. The volatile memories including Static Random Access Memory (SRAM) and Dynamic Random Access Memory (DRAM) lose their stored datum after the memory's powers are turned off while the non-volatile memories such as Read Only Memory (ROM), Electrical Erasable Programmable Read Only Memory (EEPROM) and flash still keep their stored datum even without the memory power.

In one area of electronic system applications, the combination of volatile memories and non-volatile memories becomes particularly important for situations of power interruption or power failure. For examples, data logging for transactions and server data storages, printers, medical equipments, and vehicle crash recorders are the major fields of applications. The solutions for those applications have been evolving from SRAM in conjunction with controller and battery, SRAM in conjunction with battery, to NVSRAM in conjunction with discharging capacitors. Nowadays, the solution of NVSRAM in conjunction with discharging capacitors is the most compact and integrated system for the applications.

In early development stage of semiconductor NVSRAM, non-volatile elements (such as EEPROM or flash) are formed in one cell array to a one-to-one image of one SRAM cell array. In the situation of losing power, a built-in power detection circuitry in a conventional NVSRAM device detects the power dropping and begins to move the SRAM datum to the non-volatile elements using the power of the discharging capacitors or backup batteries. Since the non-volatile elements are separated from the SRAM array, the high voltages for Non-Volatile Memory (NVM) write/erase operations do not reach the low voltage circuitry of the SRAM operations. SRAM array is used as the data buffers for non-volatile memory programming. However, this approach is less compact and less efficient due to the two separated non-volatile memory array and SRAM array with peripheral circuitries.

To combine non-volatile element and SRAM cell for forming a single NVMSRAM cell is always the goal for compactness, better operational speed performance, and cost reduction. Several NVSRAM unit cell approaches, for examples, U.S. Pat. Nos. 6,556,487, 7,164,608, 7,110,293, 7,307,872, and 7,663,917, have been proposed. Although those single-unit-cell approaches have improved the compactness, operational speed performance, and cost reduction most of the NVSRAM cells would require multiple switches to isolate the SRAM cell portion from the non-volatile element in the NVSRAM unit cell. This is due to the incompatibility of high/low voltage operations of volatile and non-volatile cell devices. Some of the approaches also require two non-volatile elements for pulling up and down the SRAM cell bitline and complementary bitline. In terms, those approaches increase the numbers of transistor elements and add more operational complexity. As in U.S. Pat. No. 6,556,487, Ratnadumar et al. apply one single non-volatile element embedded in a 6T SRAM cell 110 as shown in FIG. 1 (FIG. 4 in U.S. Pat. No. 6,55,6487). In the NVSRAM cell configuration 100 of FIG. 1, the source and drain electrodes of the non-volatile element NV are connected to the electrode of one access transistor MN3 and the output node of the inverter between MP1 and MN1 in the SRAM cell 110, respectively. For the program/erase operations of the non-volatile element NV, it is inevitable that either the source electrodes or the drain electrodes of the non-volatile elements NV need to apply a high voltage bias. In general the Metal-Oxide-Semiconductor Field Effect Transistors (MOSFETs) in SRAM cells are designed for low voltage operations based on the performance and size considerations, and incompatible with the high voltage program/erase operations of non-volatile elements. Thus, the performance and sizes of the SRAM cells 110 in the NVSRAM cells 100 must be comprised. It is also due to the incompatibility of the high/low voltage operations that the gates of MN3 and MN4 are required to form two separated wordlines (wordline 1 and wordline 2 as shown in FIG. 1) in contrast to that of the conventional 6T SRAM, where the gates of MN3 and MN4 form a single wordline. Furthermore, the non-volatile elements with the applied gate voltage below their high threshold voltages are "off" and disconnect the output nodes of MP1/MN1 inverters from the access transistors MN3 connected to bitlines. During the normal SRAM read/write operations a high control gate voltage far higher than the high and low threshold voltages of the non-volatile elements is required to pass the voltages at the output nodes of MP1/MN1 inverters through the access transistors MN3 to bitlines.

To resolve the mentioned issues, we have disclosed the new types of NVMSRAM cell devices for applying one single non-volatile element embedded in the conventional 6T (six-transistor) or 2R4T (two-resistor-four-transistor) SRAM cells.

SUMMARY OF THE INVENTION

A schematic diagram of the NVSRAM cell 200 for an N-type non-volatile element NNV embedded in the conventional 6T SRAM cell 110 (MP1, MP2, MN1, MN2, MN3, and MN4) is shown in FIG. 2. One node x1 of the N-type non-volatile element NNV is connected to the output node of inverter MP1/MN1 and an electrode of the access transistor MN3 having another electrode connected to the complementary bitline $\overline{B}$ of the SRAM cell 110. The other node y1 of the N-type non-volatile element NNV is connected to an external line D. The N-type non-volatile element NNV can be programmed to a higher threshold voltages by injecting electrons to the storing materials such as poly-silicon, nitride dielectrics, or nano-particles. The N-type non-volatile element NNV can be also erased to lower threshold voltages by taking out the electrons and slightly injecting holes in the storing materials. In SRAM read/write mode, the control gates of the non-volatile elements are applied with a gate voltage below the lower threshold voltages of the N-type non-volatile elements. The N-type non-volatile elements are thus "off" and detached from the SRAM cells 110. The read/write operations of the NVSRAM cells 200 become the normal read/write operations of SRAM cells 110.

The states of the N-type non-volatile elements with lower threshold voltages and higher threshold voltages are represented by logic "1" and "0", respectively. As shown in FIG. 3, when the NVSRAM cell array is required to load the datum from the non-volatile elements to their corresponding SRAM cells 110, SRAM write circuitries 410 (see details in FIG. 4) are enabled to initially write "0"s into all the SRAM cells 110, the voltages ($V_{x1}$, $V_{z1}$) at the output node (x1, z1) of cross-coupled inverters MP1/MN1 (through MN3 to complementary bitline $\overline{B}$) and MP2/MN2 (through MN4 to bitline B) are $V_{cc}$ and $V_{ss}$=0 (ground voltage), respectively. The wordlines (the gates of MN3 and MN4) of the SRAM cells 110 are then deselected by applying zero voltage to detach the cross-coupled inverters from the bitlines B and complementary bitlines $\overline{B}$. Meanwhile the voltage at the external line D is set to $V_{ss}$ (ground voltage). When the control gates (the selected wordline for the N-type non-volatile elements) of the N-type non-volatile elements are applied with a voltage between the lower threshold voltages and the higher threshold voltages of the N-type non-volatile elements, the N-type non-volatile elements with storing "1"s embedded in the corresponding SRAM cells 110 are turned on to pull down the output nodes x1 of inverter MP1/MN1 to $V_{ss}$ from the voltage at the external lines D. Thus, the SRAM cells 110 initially stored "0" are rewritten to "1". Since the N-type non-volatile elements with storing "0" embedded in the corresponding SRAM cells 110 are turned off the SRAM cells 110 initially stored "0" remain "0". The NVSRAM cells 200 then complete loading datum from the N-type non-volatile elements into the corresponding SRAM cells 110. After the applied control gate voltage is switched to zero voltage to detach the non-volatile elements from the SRAM cells 110, the NVSRAM cells 200 are back to their normal SRAM read/write operations.

A schematic diagram of NVSRAM cell 500 for a P-type non-volatile element PNV embedded in the conventional 6T SRAM cell 110 (MP1, MP2, MN1, MN2, MN3, and MN4) is shown in FIG. 5. One node x2 of the P-type non-volatile element PNV is connected to the output node of inverter MP1/MN1 and an electrode of the access transistor MN3 having another electrode connected to the complementary bitline $\overline{B}$ of the SRAM cell 110. The other node y2 of the P-type non-volatile element PNV is connected to an external line D. The P-type non-volatile element PNV can be programmed to a lower threshold voltages (turn off with a more positive gate voltage) by injecting electrons to the storing materials such as poly-silicon, nitride dielectrics, or nano-particles. The P-type non-volatile element PNV can be also erased to higher threshold voltages (turn on with a more negative gate voltage) by taking out the electrons and slightly injecting holes in the storing materials. In SRAM read/write mode, the control gates of the P-type non-volatile elements are applied with a high gate voltage $V_h$ more positive voltage than all the threshold voltages of the P-type non-volatile elements. All the P-type non-volatile elements are then "off" and detached from the output node x2 of inverter MP1/MN1. The read/write operations of the NVSRAM cells 500 become the normal read/write operations of SRAM cells 110.

The states of the P-type non-volatile elements with lower threshold voltages and higher threshold voltages are represented by logic "0" and "1", respectively. As shown in FIG. 6, when the NVSRAM cells 500 are required to recall the datum from the non-volatile elements to the corresponding SRAM cell 110, SRAM write circuitries 410 (FIG. 4) are enabled to initially write "1" into all the SRAM cells 110, the voltages ($V_{x2}$, $V_{z2}$) at the output nodes (x2, z2) of cross-coupled inverters MP1/MN1 (through MN3 to complementary bitline $\overline{B}$) and MP2/MN2 (through MN4 to bitline B) are $V_{ss}$=0 (ground voltage) and $V_{cc}$, respectively. The wordlines (gates of MN3 and MN4) of the SRAM cells 110 are then deselected by applying zero voltage to detach the cross-coupled inverters from the bitlines B and complementary bitlines $\overline{B}$. Meanwhile the voltage at the external line D is set to $V_{cc}$. When the control gates (the selected wordline for the P-type non-volatile elements) of P-type non-volatile elements are applied with a voltage between the lower threshold voltages and the higher threshold voltages of the P-type non-volatile elements, the P-type non-volatile elements with storing "0"s in the SRAM cells 110 are turned on to pull up the output node x2 of inverter MP1/MN1 to $V_{cc}$. Thus the SRAM cells 110 initially stored "1" are rewritten to "0". Since the P-type non-volatile elements with storing "1"s embedded in the corresponding SRAM cells 110 are turned off the SRAM cells 110 with initially stored "1" remain "1". The NVSRAM cells 500 complete loading datum from the P-type non-volatile elements into the corresponding SRAM cells 110. When the applied control gate voltage is switched to the high gate voltage $V_h$ to detach the non-volatile elements from the SRAM cells 110, the NVSRAM cells 500 are back to their normal read/write operations.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
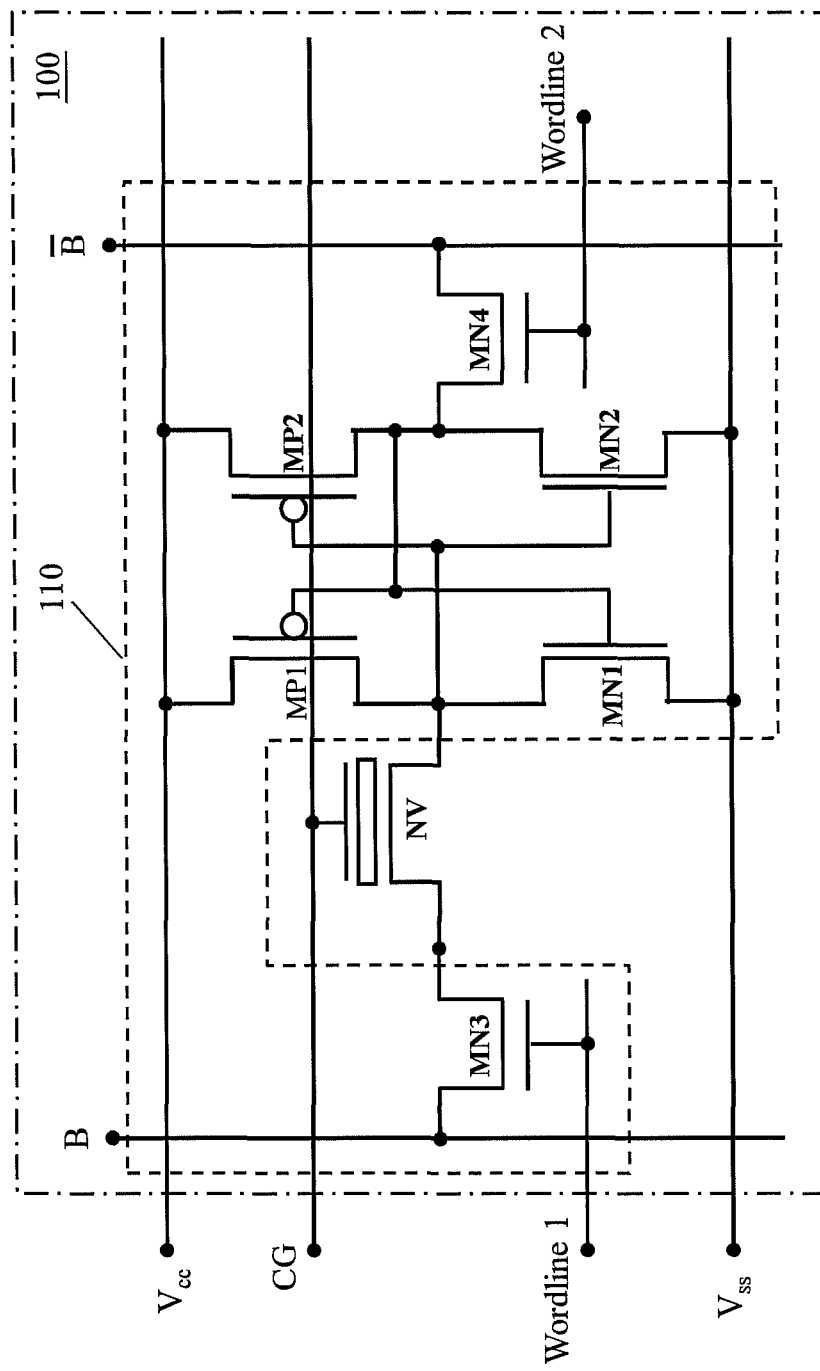
FIG. 1 shows an NVSRAM cell circuit configuration using one single non-volatile element in U.S. Pat. No. 6,556,487.
Figure 2:
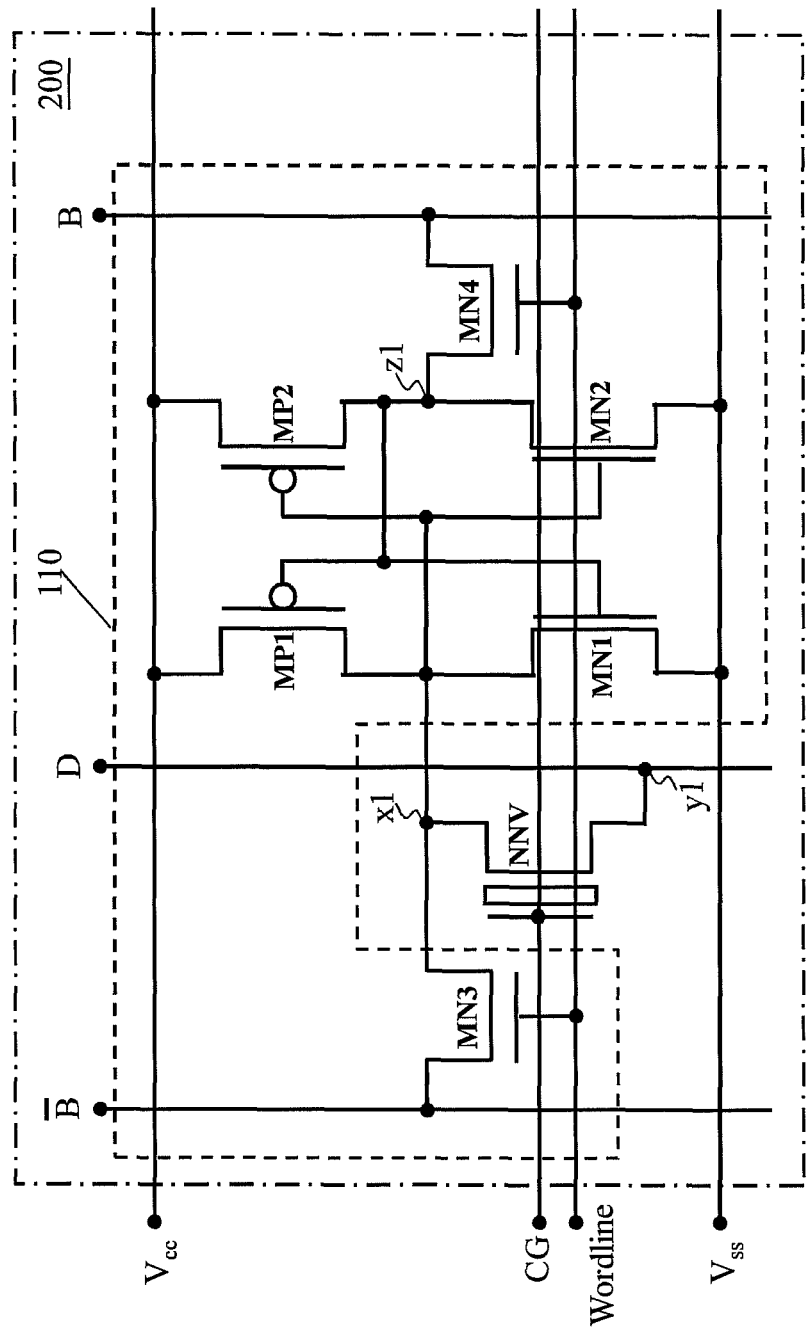
FIG. 2 shows an NVSRAM cell circuit configuration using one single N-type non-volatile element embedded in a 6T SRAM cell according to one embodiment of the present invention.

The NVSRAM cell 200 for an N-type non-volatile element NV embedded in 6T SRAM cell 110 (MP1, MP2, MN1, MN2, MN3, and MN4) is shown in FIG. 2. One node x1 of the N-type non-volatile element NV is connected to the output node of inverter MP1/MN1 and an electrode of the access transistor MN3 having another electrode connected to the complementary bitline $\overline{B}$ of the SRAM cell 110. The other node y1 of the N-type non-volatile element NNV is connected to an external line D. The N-type non-volatile element NNV can be programmed to a higher threshold voltage by injecting electrons to the storing materials such as poly-silicon, nitride dielectrics, or nano-particles. The N-type non-volatile element NNV can be also erased to lower threshold voltages by taking out the electrons and slightly injecting holes in the storing materials. In SRAM read/write mode, the control gate of non-volatile elements is applied with a gate voltage below the lower threshold voltages of the N-type non-volatile element (usually zero voltage). The N-type non-volatile element NNV is thus "off" and detached from the output node of inverter MP1/MN1. The read/write operations of the NVSRAM cells 200 become the normal read/write operations of SRAM cells 110. In one embodiment, when the SRAM cells 110 start to operate in a read mode, the bit line pair B, $\overline{B}$ are precharged to $V_{cc}$ and then the two access transistors MN3 and MN4 are turned on to allow the SRAM cells 110 to perform the read operations by means of SRAM read circuit 420. When the SRAM cells 110 start to operate in a write mode, two predetermined data bits are provided on the bit line pair B, $\overline{B}$ by SRAM write circuit 410 and then the two access transistors MN3 and MN4 are turned on to allow the SRAM cells 110 to perform the write operations.

In one embodiment of storing SRAM datum to non-volatile elements, the conventional Fowler-Nordheim tunneling can be used by applying the high voltage between the gate and the substrate of the N-type non-volatile elements to erase to lower threshold voltages. The state of the N-type non-volatile elements with lower threshold voltages is set to be the default state defined by the logic state "1". In the default operation the non-volatile elements are cleared to the lower threshold voltage state. Either by an external "STORE" command or triggered by an internal voltage supply detection circuitry the datum in the SRAM cells 110 are required to store into the non-volatile element. The programming method disclosed in U.S. Pat. No. 7,733,700 (the disclosure of which is incorporated herein by reference in its entirety) is used to apply the drain voltage of $V_{cc}$ and the voltages of reversed source/substrate biases to the N-type non-volatile elements. This programming method can program the N-type non-volatile elements to higher threshold voltages denoted by the logic state "0". At the beginning of storing sequence the gates of MN3 and MN4 (the wordline of the SRAM cells) and the external line D are biased with the low voltage $V_{ss}$, which is equal to or less than zero voltage. Thus, the SRAM bitlines B and complementary bitlines $\overline{B}$ detach from the cross-coupled inverters and the non-volatile elements. For the SRAM cells 110 with data "0", the voltages at the output nodes x1 of MP1/MN1 inverters are $V_{cc}$. When a high gate voltage (e.g., greater than the operating voltage $V_{cc}$) is applied to the control gates of the N-type non-volatile elements the N-type non-volatile elements with $V_{cc}$ at their drain electrodes (the output nodes of MP1/MN1 inverters) are programmed to higher threshold voltages. For the SRAM cells 110 with data "1"s, the voltages at the output nodes x1 of MP1/MN1 inverters are $V_{ss}$. Since both the source electrodes and drain electrodes (at the terminals of the external lines D) of the N-type non-volatile elements are biased with $V_{ss}$ the N-type non-volatile elements with the applied control gate voltage can not be programmed to higher threshold voltages. Therefore, the data in each SRAM cells 110 are loaded into their corresponding non-volatile elements accordingly.

In another embodiment of storing SRAM datum to non-volatile elements, all the non-volatile elements are initially programmed to the high threshold voltage state of default "0". In the default operation the N-type non-volatile elements are cleared to be at their higher threshold voltage state. When the datum in SRAM cells 110 are required to store into the N-type non-volatile elements we can apply the erase-down method described in U.S. Pat. No. 7,515,465 (the disclosure of which is incorporated herein by reference in its entirety), where a low gate voltage close to the intrinsic threshold voltage (near zero stored charges in the storing materials) of N-type non-volatile elements and a high drain voltage through the external line D are applied to the gate electrodes and the drain electrodes of the non-volatile elements, respectively. For the SRAM cells 110 with data "1", the voltages at the output nodes of MP1/MN1 inverters are $V_{ss}$=0. When the applied control gate voltage $V_{cg}$ close to the intrinsic threshold voltages of the non-volatile elements is applied to the control gates of the non-volatile elements, the threshold voltages of the non-volatile elements are then erased down to the lower threshold voltages for the SRAM cells 110 with data "1". For the SRAM cells 110 with data "0", the voltages at the nodes of MP1/MN1 inverters are $V_{cc}$. Since the applied gate voltage difference of the control gate to the source, $V_{cgs}=V_{cg}-V_{cc}$ is far below the intrinsic threshold voltages of the non-volatile elements, the non-volatile elements can not be erased down to lower threshold voltages for the SRAM cells 110 with data "0". Therefore, the data in each SRAM cells 110 are loaded into their corresponding non-volatile elements accordingly.

Figure 3:
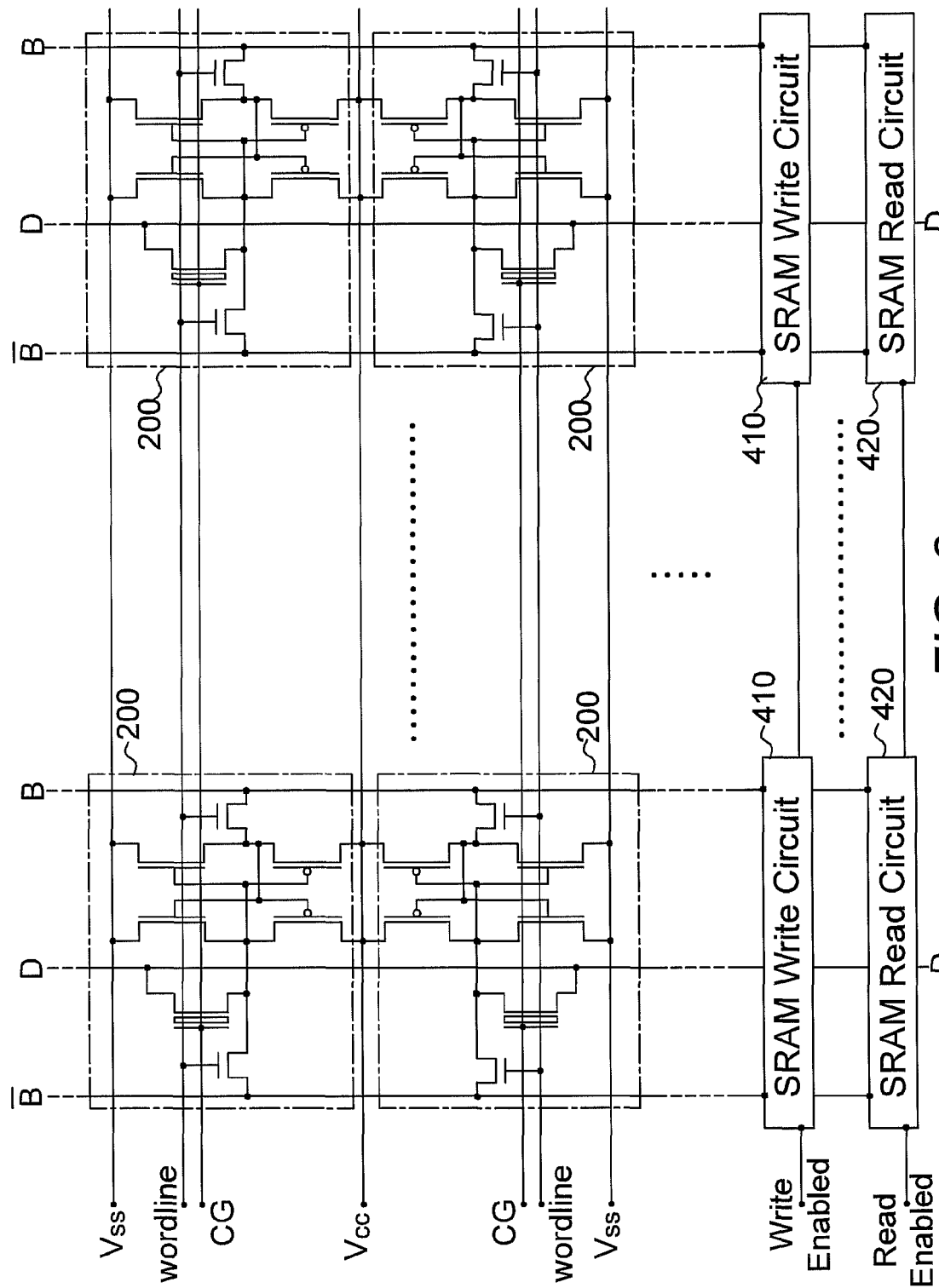
FIG. 3 shows a schematic diagram of an NVSRAM cell array and the associated SRAM write circuitries and read circuitries according to the embodiment of FIG. 2
Figure 4:
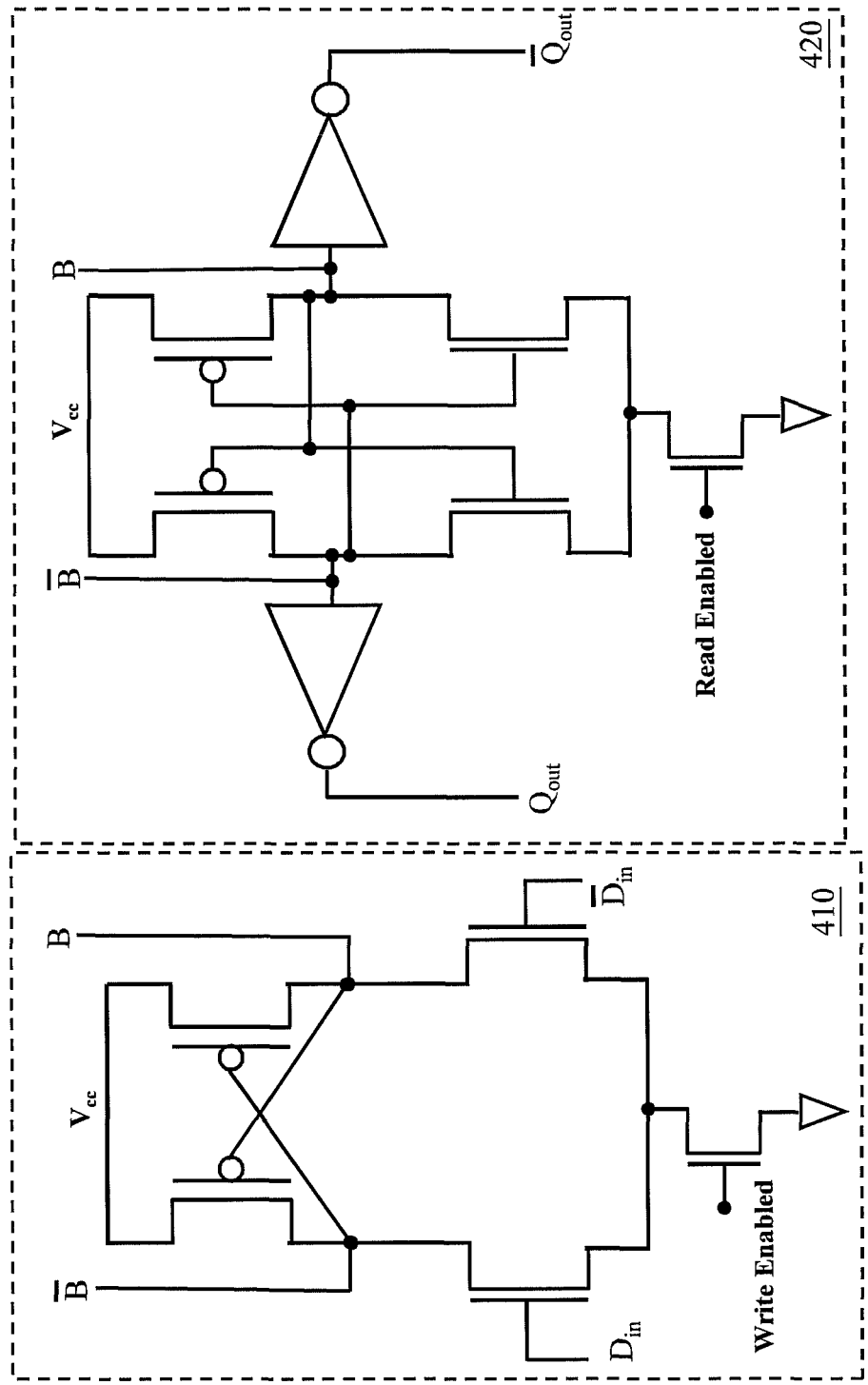
FIG. 4 shows the examples of conventional SRAM writer circuit and read circuit.

As shown in FIG. 3, to load datum from the non-volatile elements to the corresponding SRAM cells 110, the load sequence starts with enabling the SRAM write circuitries 410 to initially write "0"s into the SRAM cells 110. Thus the voltages at the output nodes (x1, z1) of cross-coupled inverters MP1/MN1 (through MN3 to complementary bitline $\overline{B}$) and MP2/MN2 (through MN4 to bitline B) are $V_{cc}$ (operating voltage) and $V_{ss}$=0 (ground voltage), respectively. The wordlines (the gates of MN3 and MN4) of the SRAM cells 110 are then deselected by applying zero voltage to detach the cross-coupled inverters from the bitlines B and complementary bitlines $\overline{B}$. Meanwhile the voltage at the external lines D is set to $V_{ss}$ (ground voltage). When the control gates (the selected wordline for the N-type non-volatile elements) of the N-type non-volatile elements are applied with a voltage between the lower threshold voltages and the higher threshold voltages of the N-type non-volatile elements, the N-type non-volatile elements with storing "1" embedded in the corresponding SRAM cells 110 are turned on to pull down the output node x1 of inverter MP1/MN1 to $V_{ss}$ from the voltage at the external lines D. Thus, the SRAM cells 110 with initially stored "0" are rewritten to "1". Since the N-type non-volatile elements with storing "0" embedded in the corresponding SRAM cells 110 are turned off the SRAM cells 110 with initially stored "0" remain "0". The NVSRAM cells 200 then complete loading datum from the N-type non-volatile elements into the corresponding SRAM cells 110. After the applied control gate voltage is switched to zero voltage to detach the non-volatile elements from the SRAM cells 110, the NVSRAM cells 200 are back to their normal SRAM read/write operations.

Figure 5:
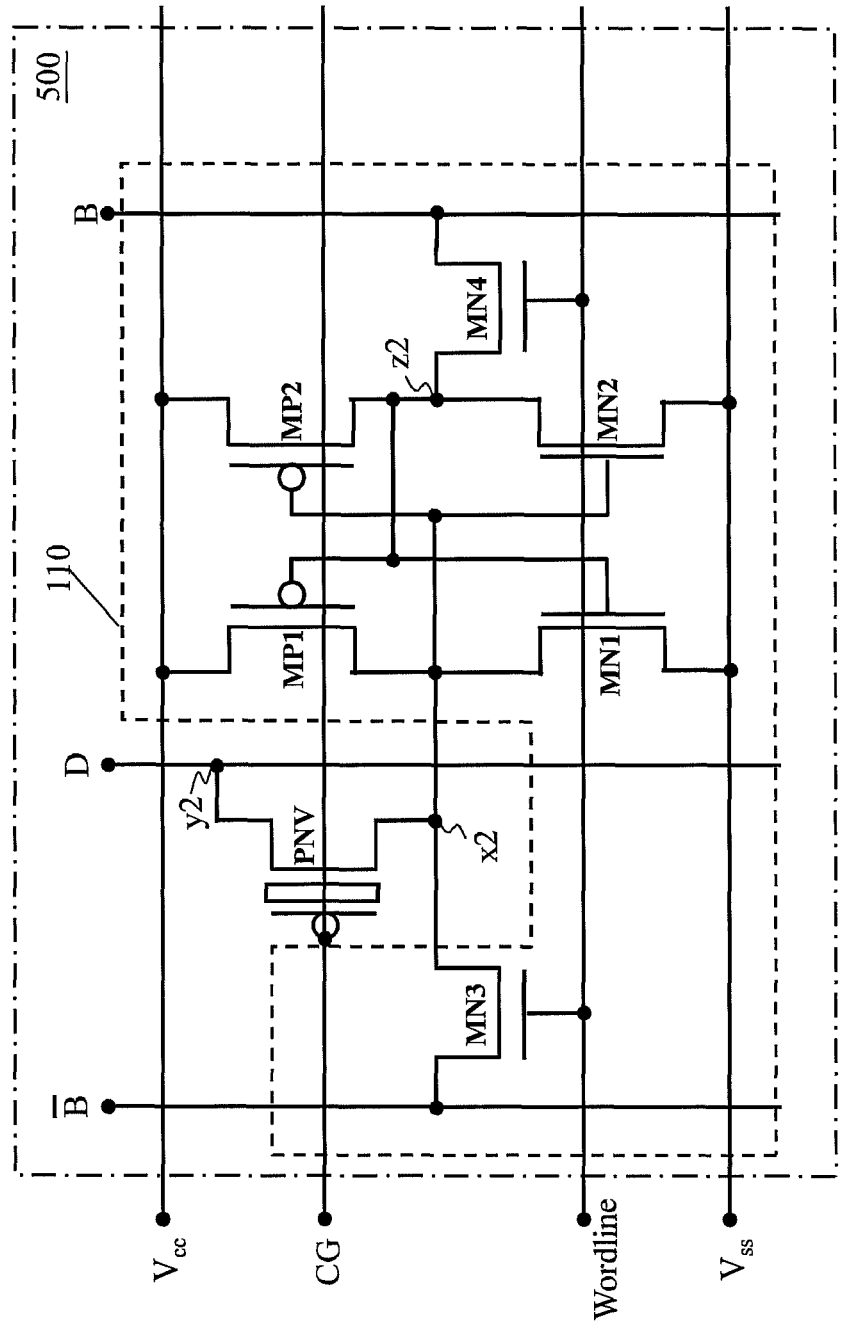
FIG. 5 shows an NVSRAM cell circuit configuration using one single P-type non-volatile element embedded in a 6T SRAM cell according to another embodiment of the present invention.

The NVSRAM cell 500 for a P-type non-volatile element PNV embedded in 6T SRAM cell 110 (MP1, MP2, MN1, MN2, MN3, and MN4) is shown in FIG. 5. One node x2 of the P-type non-volatile element PNV is connected to the output node of inverter MP1/MN1 and an electrode of the access transistor MN3 having another electrode connected to the complementary bitline $\overline{B}$ of the SRAM cell 110. The other node y2 of the P-type non-volatile element PNV is connected to an external line D. The P-type non-volatile element PNV can be programmed to a lower threshold voltages (turn off with a more positive gate voltage) by injecting electrons to the storing materials such as polysilicon, nitride dielectrics, or nano-particles. The P-type non-volatile element PNV can be also erased to higher threshold voltages (turn on with a more negative gate voltage) by taking out the electrons and slightly injecting holes in the storing materials. In SRAM read/write mode, the control gates of the P-type non-volatile elements PNV are applied with a high gate voltage $V_h$ more positive voltage than all the threshold voltages of the P-type non-volatile elements. All the P-type non-volatile elements are then "off"and detached from the output node of inverter MP1/MN1. The read/write operations of the NVSRAM cells 500 become the normal read/write operations of SRAM cells 110.

In the embodiment of storing SRAM datum to the P-type non-volatile elements, the conventional Fowler-Nordheim tunneling can be used by applying the high voltage between the gate and the substrate of the P-type non-volatile elements PNV to inject electrons from substrate to the storing materials resulting in lower threshold voltages (turn off with a more positive gate voltage). The state of the P-type non-volatile elements PNV with lower threshold voltages is set to be the default state defined by the logic state "0". On the other hand, the state of high threshold voltage of the P-type non-volatile elements PNV is represented by logic state "1". In the default operation the P-type non-volatile elements PNV are first cleared to be the lower threshold voltage state. Either by an external "STORE" command or triggered by an internal voltage supply detection circuitry the datum in the SRAM cells 110 are required to store into the non-volatile elements PNV. At the beginning of storing sequence the gates of MN3 and MN4 (the wordline of the SRAM cells) and the external line D are biased with the low voltage $V_{ss}$, which is equal to or less than zero voltage. Thus, the SRAM bitlines B and complementary bitlines $\overline{B}$ are detached from the cross-coupled inverters and the non-volatile elements. For the SRAM cells 110 with data "0", the voltages at the output nodes of MP1/MN1 inverters are $V_{cc}$. When a low gate voltage less than $V_{cc}$ is applied to the control gates of the P-type non-volatile elements the P-type non-volatile elements with $V_{cc}$ at their drain electrodes (the output nodes of MP1/MN1 inverters) are erased to higher threshold voltages. For the SRAM cells 110 with data "1", the voltages at the output nodes x2 of MP1/MN1 inverters are $V_{ss}$. Since both the source electrodes and drain electrodes (the terminals of external lines D) of the P-type non-volatile elements are biased with $V_{ss}$ the P-type non-volatile elements PNV with the low applied gate voltage to their control gate can not be erased to higher threshold voltages. Therefore, the data in each SRAM cells 110 are loaded into their corresponding non-volatile elements accordingly.

In another embodiment of storing SRAM datum to P-type non-volatile elements, all the non-volatile elements are initially erased to the high threshold voltage state of default "1". In the default operation the P-type non-volatile elements PNV are cleared to be at their higher threshold voltage state. When the datum in SRAM cells 110 are required to store into the P-type non-volatile elements PNV we can apply the program-up method described in U.S. Pat. No. 7,515,465 (the disclosure of which is incorporated herein by reference in its entirety), where a low gate voltage close to the intrinsic threshold voltage (near zero stored charges in the storing materials) of P-type non-volatile elements PNV and a high drain voltage through the external line D are applied to the gate electrodes and the drain electrodes of the non-volatile elements, respectively. For the SRAM cells 110 with data "0", the voltages at the output nodes x2 of MP1/MN1 inverters are $V_{cc}$. When the applied control gate voltage $V_{cg}$ close to the intrinsic threshold voltages of the P-type non-volatile elements PNV is applied to the control gate, the threshold voltages of the P-type non-volatile elements PNV are then programmed down to the lower threshold voltages for the SRAM cells 110 with data "0". For the SRAM cells with data "1", the voltages at the voltage at the nodes x2 of MP1/MN1 inverters are $V_{ss}$=0. Since the applied gate voltage difference of the control gate to the source, $V_{cgs}$=$V_{cg}$ is positive and the P-type non-volatile element PNV is off, the threshold voltage of the P-type non-volatile element PNV memory can not be erased down to lower threshold voltages for the SRAM cells with data "1". Therefore, the data in each SRAM cells 110 are loaded into their corresponding non-volatile elements accordingly.

Figure 6:
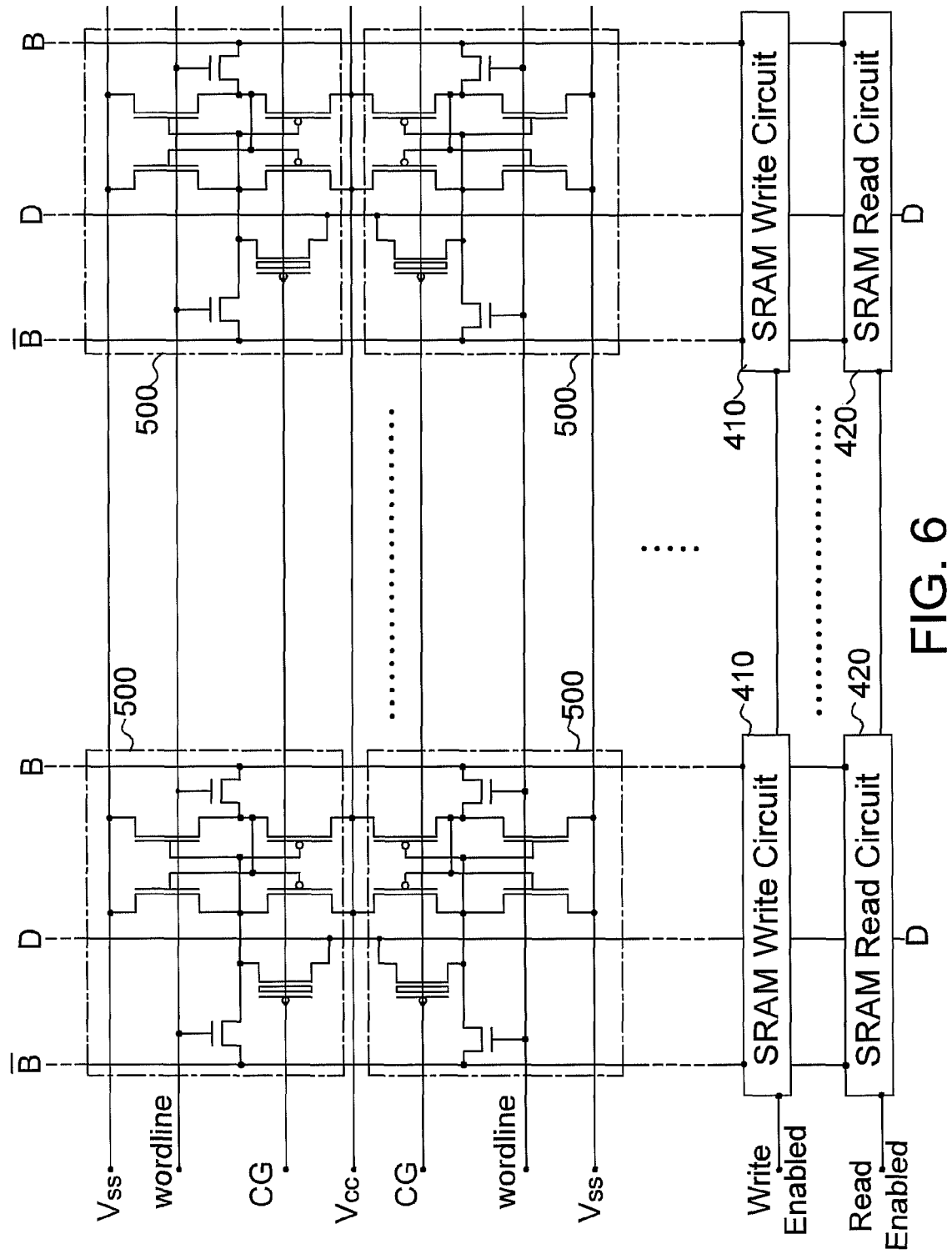
FIG. 6 shows a schematic diagram of an NVSRAM cell array and the associated SRAM write circuitries and read circuitries according to the embodiment of FIG. 5.

As shown in FIG. 6, to load datum in the P-type non-volatile elements PNV to the corresponding SRAM cells 110, the load sequence starts with enabling the SRAM write circuitries 410 to initially write "1" into the SRAM cells 110. Thus the voltages at the output nodes of cross-coupled inverters MP1/MN1 (through MN3 to complementary bit-line) and MP2/MN2 (through MN4 to bitline) are $V_{ss}$=0 (ground voltage) and $V_{cc}$, respectively. The wordlines (the gates of MN3 and MN4) of the SRAM cells 110 are then deselected by applying zero voltage to detach the cross-coupled inverters from the bitlines B and complementary bitlines $\overline{B}$. Meanwhile the voltage at the external lines D is set to $V_{cc}$. When the control gates (the selected wordline for the P-type non-volatile elements) of the P-type non-volatile elements are applied with a low voltage between the lower threshold voltages and the higher threshold voltages of the P-type non-volatile elements, the P-type non-volatile elements with storing "0" embedded in the corresponding SRAM cells 110 are turned on to pull up the output node x2 of inverter MP1/MN1 to $V_{cc}$ from the voltage at the external lines D. Thus, the SRAM cells initially stored "1" are rewritten to "0". Since the P-type non-volatile elements with storing "1" embedded in the corresponding SRAM cells are turned off the SRAM cells initially stored "1" remain "1". The NVSRAM cells 500 then complete loading datum from the P-type non-volatile elements into the corresponding SRAM cells 110. After the applied control gate voltage is switched to a high gate voltage $V_h$ more positive voltage than all the threshold voltages of the P-type non-volatile elements to detach the non-volatile elements PNV from the SRAM cells 110, the NVSRAM cells 500 are back to their normal SRAM read/write operations.

Figure 7:
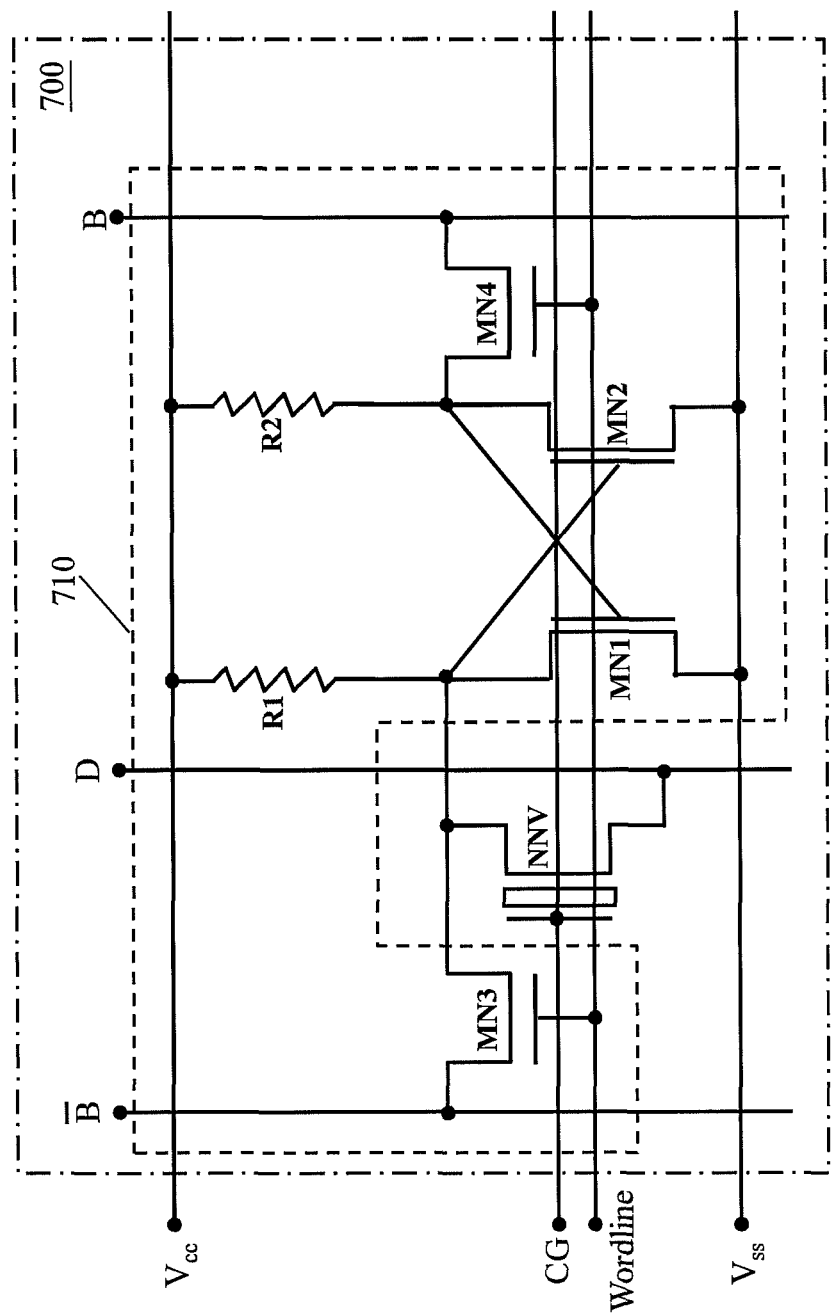
FIG. 7 shows an NVSRAM cell circuit configuration using one single N-type non-volatile element embedded in a 2R4T SRAM cell according to another embodiment of the present invention.
Figure 8:
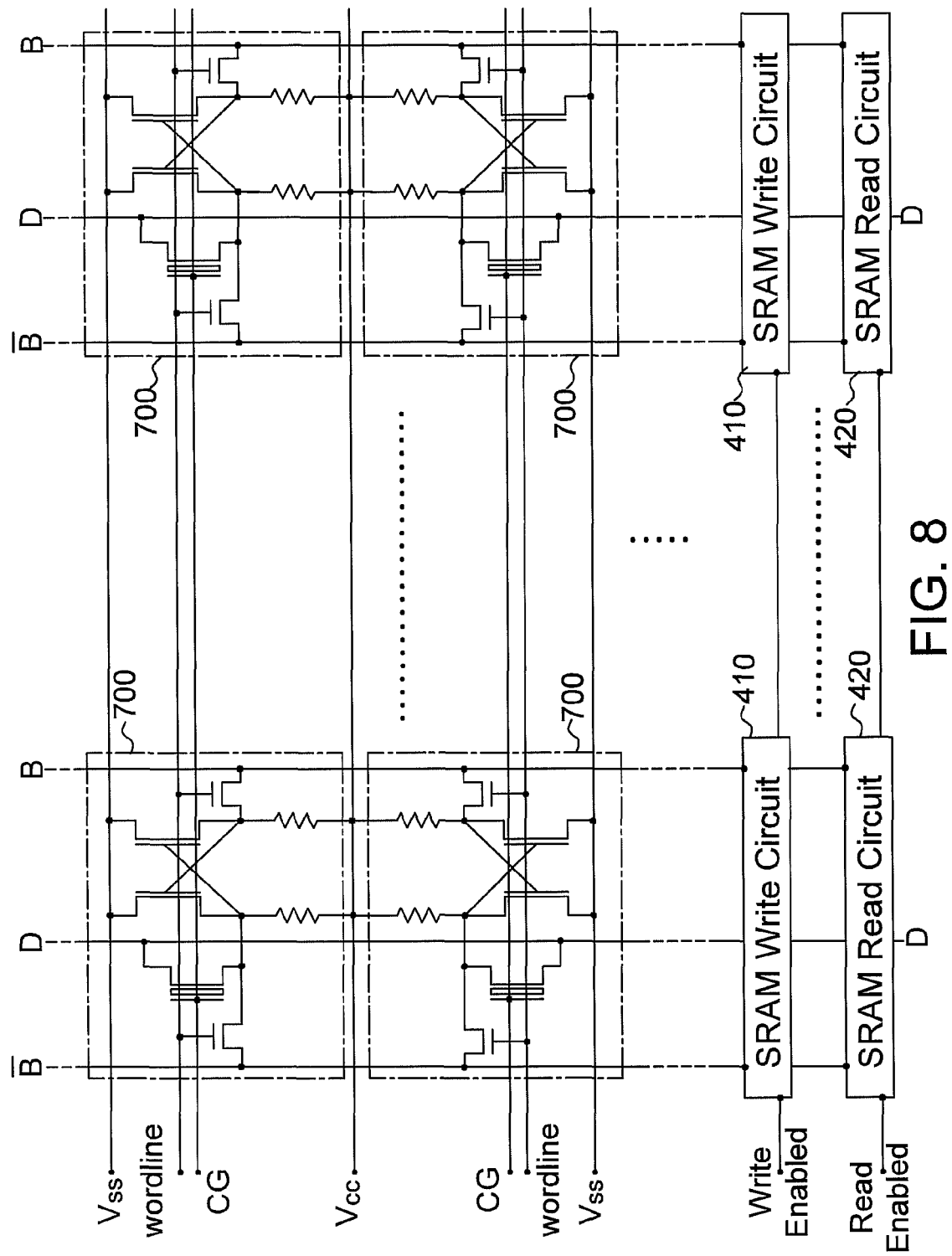
FIG. 8 shows a schematic diagram of an NVSRAM cell array and the associated SRAM write circuitries and read circuitries according to the embodiment of FIG. 7.

In another embodiment for N-type non-volatile element embedded in 2R4T (two-resister-four-transistor) SRAM cell 710, a schematic diagram of NVSRAM cell 700 is shown in FIG. 7. The corresponding NVSRAM cell array view, and their SRAM write circuitries 410 and read circuitries 420 are shown in FIG. 8. For the NVSRAM cells 700 in FIG. 7, the read/write operation in SRAM mode, the operation of storing SRAM datum to their corresponding N-type non-volatile elements, and the operation of loading datum from the N-type non-volatile elements NNV to SRAM cells 710 are the same as those of the NVSRAM cells 200 with an N-type non-volatile element NNV embedded in a 6TSRAM cell 110 shown in FIG. 2.

Figure 9:
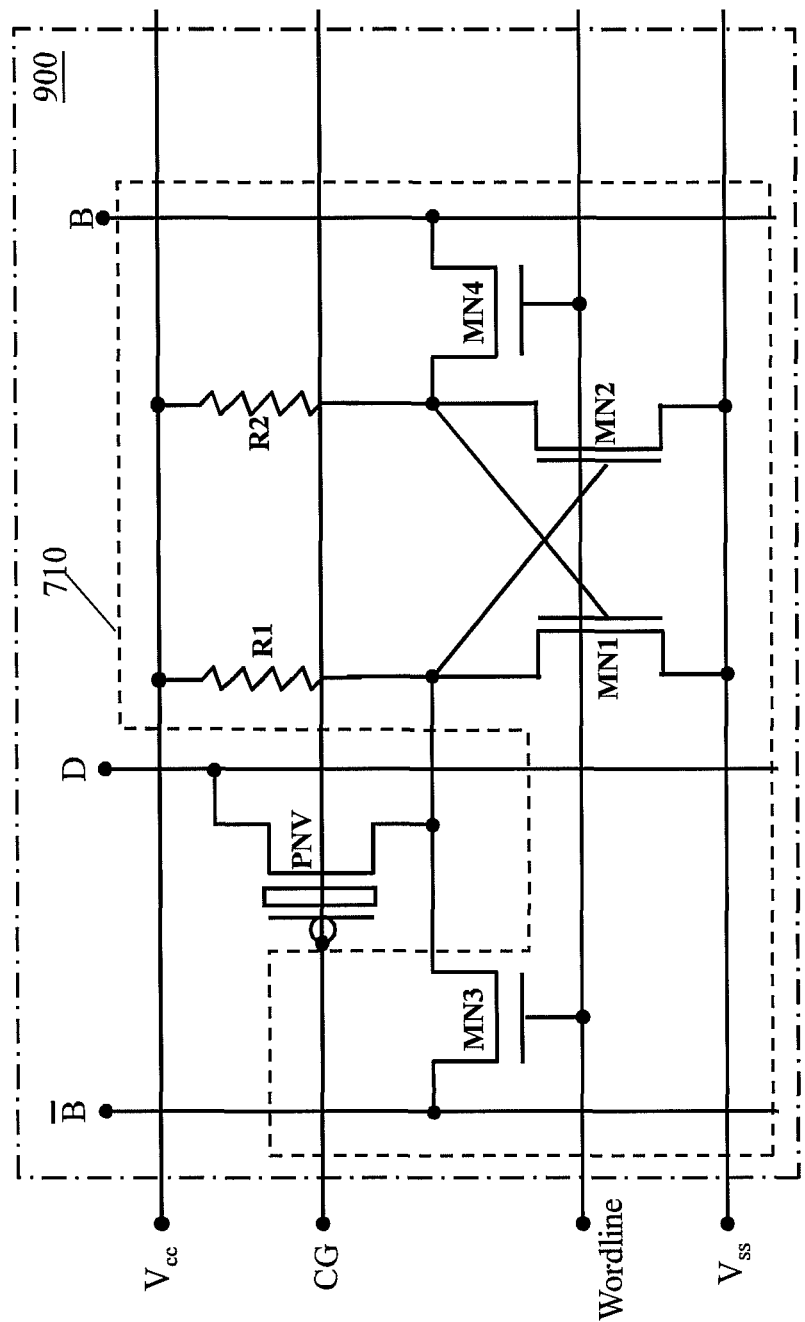
FIG. 9 shows an NVSRAM cell circuit configuration using one single P-type non-volatile element embedded in a 2R4T SRAM cell according to another embodiment of the present invention.
Figure 10:
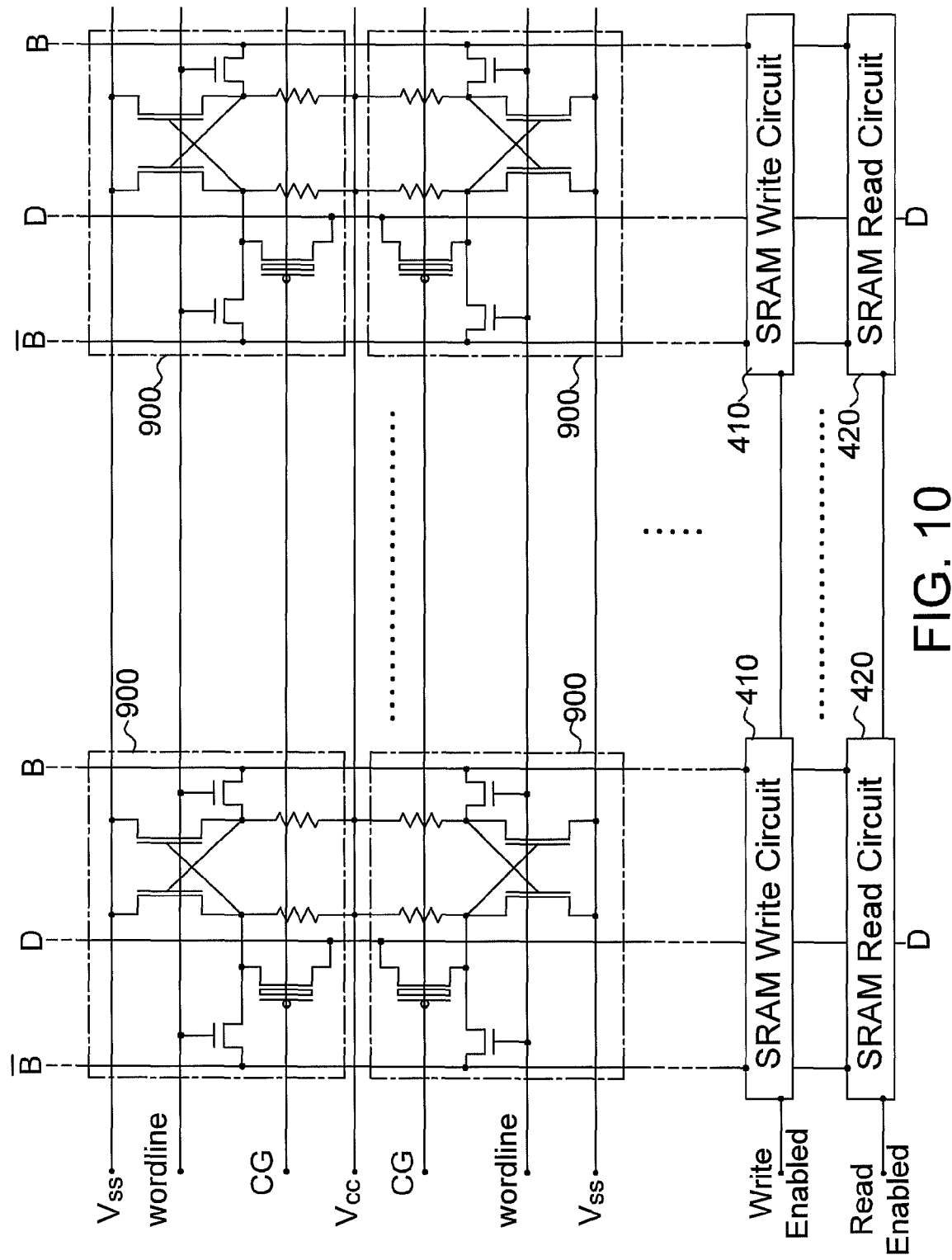
FIG. 10 shows a schematic diagram of an NVSRAM cell array and the associated SRAM write circuitries and read circuitries according to the embodiment of FIG. 9.

In another embodiment for P-type non-volatile element embedded in 2R4T (two-resister-four-transistor) SRAM cell 710, a schematic diagram of NVSRAM cell 900 is shown in FIG. 9. The corresponding NVSRAM cell array view, and their SRAM write circuitries 410 and read circuitries 420 are shown in FIG. 10. For the NVSRAM cells 900 in FIG. 9, the read/write operation in SRAM mode, the operation of storing SRAM datum to their corresponding P-type non-volatile elements, and the operation of loading datum from P-type non-volatile elements PNV to SRAM cells 710 are the same as those of the NVSRAM cells 500 with a P-type non-volatile element PNV embedded in a 6TSRAM cell 110 in FIG. 5.

Please note, in the above disclosure, the direction of each external line D is parallel to the bit line pair B, $\overline{B}$. However, this is regarded as an embodiment and is not a limitation of the present invention. In the actual implementations, the direction of the external line D depends on the array and circuit design and this also falls in the scope of the invention.

Further, please note, in the above disclosure, the non-volatile element NV is coupled between the output node (x1 or x2) of the inverter MP1/MN1 and the external line D. However, this is regarded as an embodiment and is not a limitation of the present invention. In an alternative embodiment, the non-volatile element NV is coupled between the output node (z1 or z2) of the inverter MP2/MN2 and the external line D.

In summary, we have disclosed new NVSRAM cell devices and methods of operations. The new NVSRAM cell devices have the same read/write performance of SRAM and non-volatile properties of non-volatile memory.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A non-volatile static random access memory (NVS-RAM) device with a single semiconductor non-volatile memory element, comprising:
   an SRAM element comprising:
   a latch having a first output node and a second output node for retaining a data bit; and
   two access transistors whose gates are connected together to form a word line, one of the two access transistors being connected between the first output node and one of a bit line pair, the other access transistor being connected between the second output node and the other of the bit line pair; and
   the single semiconductor non-volatile memory element being a single-transistor type consisting of four terminals which are a first source/drain electrode, and a second source/drain electrode, a control gate electrode and a body electrode, wherein the first source/drain electrode is connected to a voltage line only and the second source/drain electrode is directly connected to both one of the two output nodes and one of the two access transistors without any switching transistor connected between the voltage line and the one of the two output nodes;
   wherein a predetermined datum is written to the latch from the bit line pair to cause the one of the output nodes to have a default voltage by turning on the two access transistors, the latch and the single semiconductor non-volatile memory element are isolated from the bit line pair by turning off the two access transistors, one of a ground voltage and an operating voltage of the SRAM element is applied to the voltage line, and an intermediate voltage is applied to a control gate of the single semiconductor non-volatile memory element to enable the non-volatile data bit stored in the single semiconductor non-volatile memory element to be written to the SRAM element; and
   wherein the intermediate voltage is between a first threshold voltage and a second threshold voltage of the single semiconductor non-volatile memory element.

2. The NVSRAM device according to claim 1, wherein the latch comprises two cross-coupled inverters.

3. The NVSRAM device according to claim 2, wherein the two cross-coupled inverters comprise a first inverter and a second inverter, wherein the first inverter comprises a first P-type MOSFET and a first N-type MOSFET and the second inverter comprises a second P-type MOSFET and a second N-type MOSFET, wherein gates of the first P-type MOSFET and the first N-type MOSFET and drains of the second P-type MOSFET and the second N-type MOSFET are connected together to form the second output node, and wherein gates of the second P-type MOSFET and the second N-type MOSFET and drains of the first P-type MOSFET and the first N-type MOSFET are connected together to form the first output node.

4. The NVSRAM device according to claim 1, wherein when the latch reads data from the bit line pair or writes data to the bit line pair, the single semiconductor non-volatile memory element is turned off so that the single semiconductor non-volatile memory element is isolated from the SRAM element.

5. The NVSRAM device according to claim 1, wherein the NVSRAM device operates as an individual SRAM element does when the single semiconductor non-volatile memory element is turned off.

6. A method of loading an non-volatile storing data bit from a single semiconductor non-volatile memory element into an SRAM element in a non-volatile static random access memory (NVSRAM) device with the single semiconductor non-volatile memory element, the SRAM element comprising a latch and two access transistors, the latch having a first output node and a second output node, gates of the two access transistors being connected together to form a word line, one of the two access transistors being connected between the first output node and one of a bit line pair, the other access transistor being connected between the second output node and the other of the bit line pair, the single semiconductor non-volatile memory element being a single-transistor type consisting of four terminals which are a first source/drain electrode, a second source/drain electrode, a control gate electrode and a body electrode, wherein the first source/drain electrode is connected to a voltage line only and the second source/drain electrode is directly connected to both a connecting node and one of the two access transistors without any switching transistor connected between the voltage line and the connecting node, the connecting node being one of the two output nodes, the method comprising:
  writing a predetermined datum to the latch from the bit line pair to cause the connecting node to have a default voltage by turning on the two access transistors;
  isolating the latch and the single semiconductor non-volatile memory element from the bit line pair by turning off the two access transistors;
  applying one of a ground voltage and an operating voltage of the SRAM element to the voltage line; and
  applying an intermediate voltage to a control gate of the single semiconductor non-volatile memory element to enable the non-volatile data bit stored in the single semiconductor non-volatile memory element to be written to the SRAM element;
  wherein the intermediate voltage is between a first threshold voltage and a second threshold voltage of the single semiconductor non-volatile memory element.

7. The method according to claim 6, further comprising:
  isolating the single semiconductor non-volatile memory element from the SRAM element by turning off the single semiconductor non-volatile memory element after the step of applying the intermediate voltage.

8. The method according to claim 6, further comprising:
  selectively providing the predetermined datum on the bit line pair by means of an SRAM write circuit before the step of writing.

9. The method according to claim 6, wherein the step of applying one of the ground voltage and the operating voltage comprises:
  applying the ground voltage to the voltage line if the single semiconductor non-volatile memory element is N-type, otherwise applying the operating voltage to the voltage line.

10. The method according to claim 6, wherein the default voltage is the operating voltage if the single semiconductor non-volatile memory element is N-type, otherwise the default voltage is the ground voltage.

11. The method according to claim 10, wherein the first threshold voltage is less than the second threshold voltage.

12. The method according to claim 11, further comprising:
  causing the single semiconductor non-volatile memory element having the first threshold voltage to be turned on to set the connecting node to the ground voltage if the single semiconductor non-volatile memory element is N-type, otherwise causing the single semiconductor non-volatile memory element having the first threshold voltage to be turned on to set the connecting node to the operating voltage after the step of applying the intermediate voltage.

13. The method according to claim 11, further comprising:
  causing the single semiconductor non-volatile memory element having the second threshold voltage to be turned off to maintain the default voltage at the connecting node after the step of applying the intermediate voltage.

14. The method according to claim 6, wherein the SRAM element is a six-transistor SRAM element or a two-resistor-four-transistor SRAM element.

* * * * *